United States Patent [19]

Asazuma et al.

[11] Patent Number: 4,913,612
[45] Date of Patent: Apr. 3, 1990

[54] APPARATUS FOR STORING AND FEEDING ELECTRONIC COMPONENTS HAVING IN-LINE LEADS INTO AN INSERTING MACHINE

[75] Inventors: Yoichi Asazuma, Fujisawa; Shigeaki Mori, Tokyo, both of Japan

[73] Assignee: Toray Engineering Co., Ltd., Osaka, Japan

[21] Appl. No.: 515,146

[22] Filed: Jul. 19, 1983

[51] Int. Cl.$^4$ ............... B65G 59/06; H05K 13/02
[52] U.S. Cl. .................... 414/403; 414/795.8
[58] Field of Search ............ 414/403, 404, 413, 411, 414/798.9, 798, 795.8; 221/254, 268; 29/741, 759, 809

[56] References Cited

U.S. PATENT DOCUMENTS

| | | | |
|---|---|---|---|
| 3,760,484 | 9/1973 | Kowalski | 29/809 X |
| 4,063,347 | 12/1977 | Woodman, Jr. | 29/809 X |
| 4,222,166 | 9/1980 | Kurek et al. | 414/404 X |
| 4,401,234 | 8/1983 | Droira et al. | 29/741 X |

FOREIGN PATENT DOCUMENTS 57-18399  1/1982  Japan .

Primary Examiner—David A. Bucci
Attorney, Agent, or Firm—Armstrong, Nikaido, Marmelstein, Kubovcik & Murray

[57] ABSTRACT

Apparatus for storing and feeding electronic components to a component inserting machine comprising a plurality of component storing and feeding units having a pair of slanted, upper and lower guiderails for movably supporting stick-magazine holders, the lower guide rail having a component discharge opening with a raceway extending downwardly toward the inserting machine. A stick-magazine holder on the slanted guiderails moves therealong, under a first stick magazine, abuts against an abutment on the lower guiderail, is aligned with the discharge opening and the first stick magazine is released toward the raceway. A pusher pushes the first stick magazine upward away from the abutment and permits the holder to advance by one step so that a second stick magazine in the holder is brought to abut against the abutment. Upon completion of component release from the last stick magazine in that holder and shifting of the last stick magazine, the holder is released and moves down the guiderail, permitting a subsequent stick-magazine holder to move into the component storage and release section.

20 Claims, 8 Drawing Sheets

APPARATUS FOR STORING AND FEEDING ELECTRONIC COMPONENTS HAVING IN-LINE LEADS INTO AN INSERTING MACHINE

BACKGROUND OF THE INVENTION (1) Field of the Invention

The present invention relates, generally, to the art of automatically inserting electronic components having in-line leads, such as dual-inline packages (DIP's), into circuit boards and, more particularly, to an apparatus for storing and feeding such components into a component inserting machine.

(2) Description of the Prior Art

U.S. Pat. No. 4,063,347 to Woodman, Jr. discloses a machine for sequentially inserting multilead components, such as DIP's, into circuit boards. In the machine, components are released from a plurality of magazine sections and are temporarily stored in a magazine assembly. These are then selectively taken up therefrom one by one by a computer-controlled picker mechanism and are transferred to an inserting head. Each magazine section comprises a plurality of so-called "stick magazines" having through channels in which the components are received in an end-to-end arrangement. After all the components in any one stick magazine are released, the empty stick magazine is removed from the magazine section for manual replacement with a new stick magazine loaded with components. The need for replacement of stick magazines means the inserting machine often has to be stopped, making a continuous inserting operation impossible.

Japanese Unexamined Patent Publication (Kokai) No. 57-18399, published Jan. 30, 1982, describes a component inserting machine provided with an automatic feed mechanism. As shown in FIGS. 1A to 1C of that publication, the inserting machine comprises a component storage and dispensing section 1a, a conveyor section 1b, a cutting and conforming section 1c, an inserting section 1d, and an X-Y table. The storage and dispensing section is specifically designed for the storage of a large amount of components. Toward this end, the storage and dispensing section is provided with a slanted tray capable of receiving thereon a plurality of magazine holders or cassette holders (see FIGS. 1A to 1C). Each magazine holder is adapted to accommodate a stack of "stick magazines" as shown in FIG. 3. The components received in the lowermost stick magazine are released one by one by means of an escapement mechanism (FIGS. 5A and 5B). The magazine holder 5 is provided with a detent mechanism 6 (FIG. 3) for releasably retaining the lowermost stick magazine received in the magazine holder. Upon completion of the release of all the components from the lowermost stick magazine, the detent mechanism is released to permit the now empty lowermost stick magazine to be dropped out of the magazine holder through an aperture 5c provided in the bottom of the holder. The next stick magazine then descends to the lowermost position so that the components are then released from the next magazine, thereby assuring a fairly continuous supply of components. Actuation of the detent mechanism and discharge of the lowermost stick magazine are repeated until all the stick magazines received in the magazine holder are dropped therefrom. In this apparatus, however, the magazine holder remains in the tray even after all the stick magazines are released from that holder. Thus, the empty magazine holder must be removed manually from the tray and replaced with a fresh magazine holder filled with stick magazines. The replacement of magazine holders is not only cumbersome, but also results in considerable downtime, particularly in a high-speed inserting machine.

SUMMARY OF THE INVENTION

With the foregoing problems in view, the primary object of the present invention is to provide an apparatus for storing and feeding electronic components with in-line leads into an inserting machine, which apparatus is capable of completely continuously supplying the components into an inserting machine.

Another object of the invention is to provide an apparatus of the nature described capable of storing a larger amount of electronic components at a time.

A further object of the invention is to provide an apparatus of the nature described wherein the components are delivered without trouble such as jamming.

Still another object of the invention is to provide an apparatus of the kind mentioned in which magazine holders can be loaded on and unloaded from the apparatus in a very simple manner.

Toward these ends, the apparatus for storing and feeding in-line lead type components according to the invention comprises a series of storing and feeding units mounted on a machine frame in a side-by-side relation. Each storing and feeding unit includes a pair of vertically spaced, slanted guiderails on which stick-magazine holders retaining a stack of "stick magazines" are movably loaded. A stick-magazine holder when loaded on the guiderails moves under the action of gravity along a slanted path into a component storage and release section provided on the frontal upper part of the guiderails, in which section the electronic components received in respective stick magazines are released and delivered toward an inserting machine. After release of components, the empty magazine holder is released from the component storage and release section and slides into an empty holder storage section provided on the lower rear part of the guiderails, thereby permitting a subsequent stick-magazine holder loaded with components to slide into the component storage and release section and assure a continuous supply of components.

More specifically, each storing and feeding unit comprises at least two stick-magazine holders for resiliently retaining by friction a stack of vertically extending and superposed "stick magazines" in such a manner as to prevent them from sliding within the holders under the action of gravity but to permit them to slide longitudinally when an additional force is applied at an end thereof. The magazine holder has a length slightly less than that of the stick magazines so that a predetermined length of stick magazines when retained in the magazine holder projects outward beyond the holder.

The storing and feeding unit further comprises a pair of opposite, parallel upper and lower guiderails, preferably in the form of shaped channel members, spaced apart from each other along a vertical plane to define a path for the stick-magazine holders. The guiderails are held inclined rearward and downward with respect to the horizontal plane so that the stick-magazine holders when loaded on the frontal upper end of the guiderails will move under the action of gravity toward the rear lower end thereof along the inclined path. The guiderails are provided at the frontal upper part thereof with a component storage and release section for storing stick-magazine holders charged with the components and at the rear lower part thereof with an empty holder storage section for storing empty magazine holders.

Each stick-magazine holder is provided with carrier means, such as wheels, engageable with the guiderails for movably carrying and guiding the holder to travel along the slanted guiderails under the action of gravity.

Near the lower end of the component storage and release section, the lower guiderail is provided with a component discharge opening from which a raceway extends downward toward the magazine assembly of a conventional inserting machine.

Each storing and feeding unit includes an abutment arranged across the passageway in which the lower part of the stick magazines projecting downward beyond the holder is to travel as the magazine holder moves along the guiderails. The abutment is located adjacent to the discharge opening in such a position that when the downward projecting lower part of the stick magazine in the moving holder abuts thereagainst, that stick magazine is arrested in alignment with the discharge opening.

Each storing and feeding unit further comprises means for monitoring the release of components from the stick magazine aligned with the discharge opening, and pusher means responsive to the monitoring means for pushing the empty stick magazine at the discharge opening upward to shift it out of engagement with the abutment.

With this arrangement, when a stick-magazine holder is loaded with component-containing stick magazines and is loaded on the guiderails, it will move down along the inclined guiderails under the action of gravity into the component storage and release section until the lowermost stick magazine abuts against the abutment and is held in alignment with the discharge opening in the lower guiderail. In this position, the components received in the lowermost stick magazine are released under the action of gravity through the discharge opening into the raceway. Upon release of all the components from the lowermost stick magazine, the monitoring means issues a signal to operate the pusher means so that the now empty stick magazine at the discharge opening is shifted upward to be disengaged from the abutment, thereby allowing the magazine holder to move by one step until a next or subsequent stick magazine in the holder abuts against the abutment. Release of components and actuation of pusher means are repeated until components are discharged from all the stick magazines in the first magazine holder. As the pusher means shifts the last or uppermost stick magazine in the holder, the holder is now released from the storage and release section and allowed to slide into the empty holder storage section. Thus, a subsequent magazine holder full of components is then allowed to move into the storage and release section.

Preferably, each of the stick-magazine holders comprises a pair of spaced, parallel frame members rigidly connected with each other by at least one first side plate secured to a side of the frame members, at least one second side plate mounted detachably to the other side of the frame members, and means for resiliently biasing the second side plate toward the first side plate to resiliently retain by friction a stack of stick magazines therebetween.

It is advantageous to provide a shoe on the upper guiderail to prevent stick magazines located subsequent to the stick magazine aligned with the discharge opening from being shifted upward together with the stick magazine at the discharge opening as the latter is pushed up by the pusher means.

The guiderails preferably have a sufficient length to store at least two magazine holders in each one of the guiderail sections.

Preferably, a manually releasable stop means may be provided at the rear end of the lower guiderail to prevent the empty magazine holder from slipping out therefrom.

Preferably, the component release monitoring means may comprise a first detecting means provided at the upper end of the raceway for detecting the number of components passing the raceway upper end and a second detecting means provided at the lower end of the raceway for detecting the number of components passing the raceway lower end.

This invention also provides tools to facilitate loading of magazine holders onto the guiderails.

Other features and advantages of the present invention will become apparent from the following description.

DESCRIPTION OF THE PREFERRED EMBODIMENT

Figure 1:
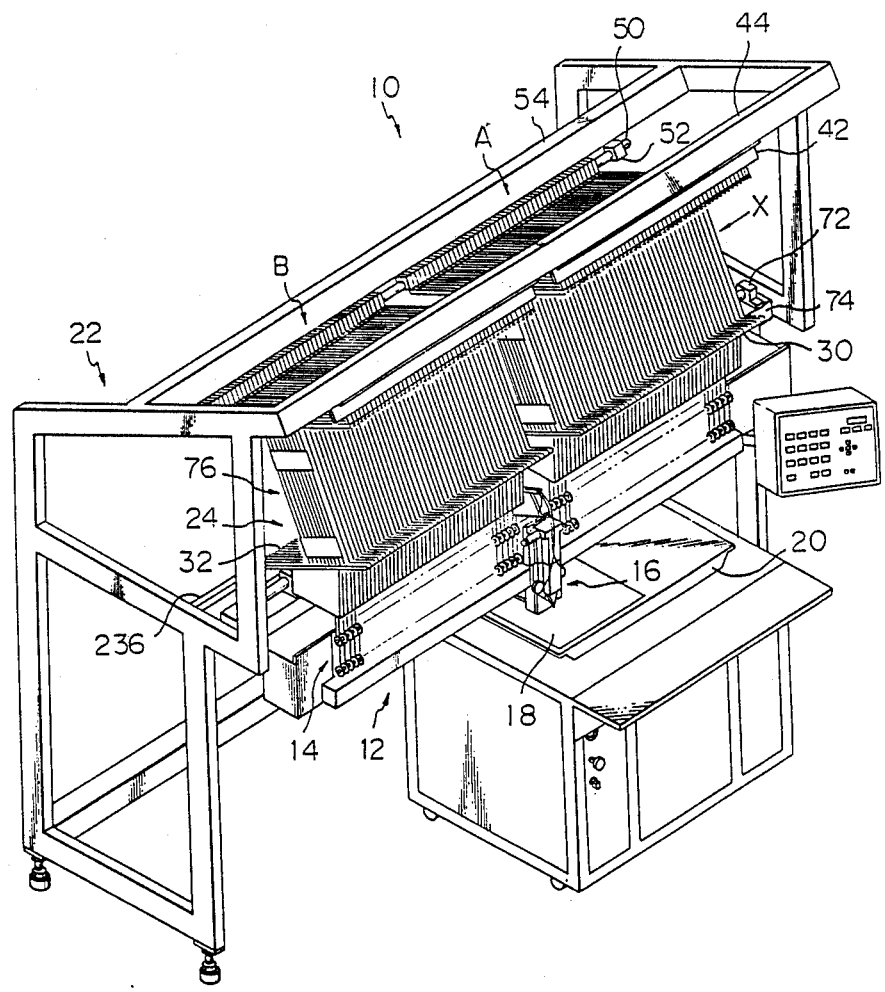
FIG. 1 is a perspective view of the apparatus according to the invention which is operatively assembled to a conventional component inserting machine.

The presently preferred embodiment of the invention will now be described with reference to the accompanying drawings. Referring to FIG. 1, there is shown a component storing and feeding apparatus generally designated 10 according to the present invention as combined with a conventional inserting machine generally designated 12, which may be, for example, of the type described in U.S. Pat. No. 4,063,347. The inserting machine 12 comprises a magazine assembly generally designated 14 for receiving the supply of components from the storing and feeding apparatus 10, computer-controlled picker mechanism (not shown) for selectively releasing the components one by one from the magazine assembly, an inserting head 16 for inserting the components in a circuit board 18 positioned on an X-Y table 20, and a clinch mechanism (not shown). As the present invention is not directed to the inserting machine per se, details thereof will not be described herein. For the detailed construction of the inserting machine, one may refer to the disclosure of U.S. Pat. No. 4,063,347.

The apparatus 10 comprises a frame structure 22, which may be common to that of the inserting machine 12, and a plurality of component storing and feeding units generally designated 24 mounted thereon. In the illustrated embodiment, the apparatus includes two groups A and B of such units 24, each group comprising 46 units arranged in a side-by-side relation. As these storing and feeding units 24 are identical with each other, reference will be made hereinafter to only one of the units 24.

Figure 2:
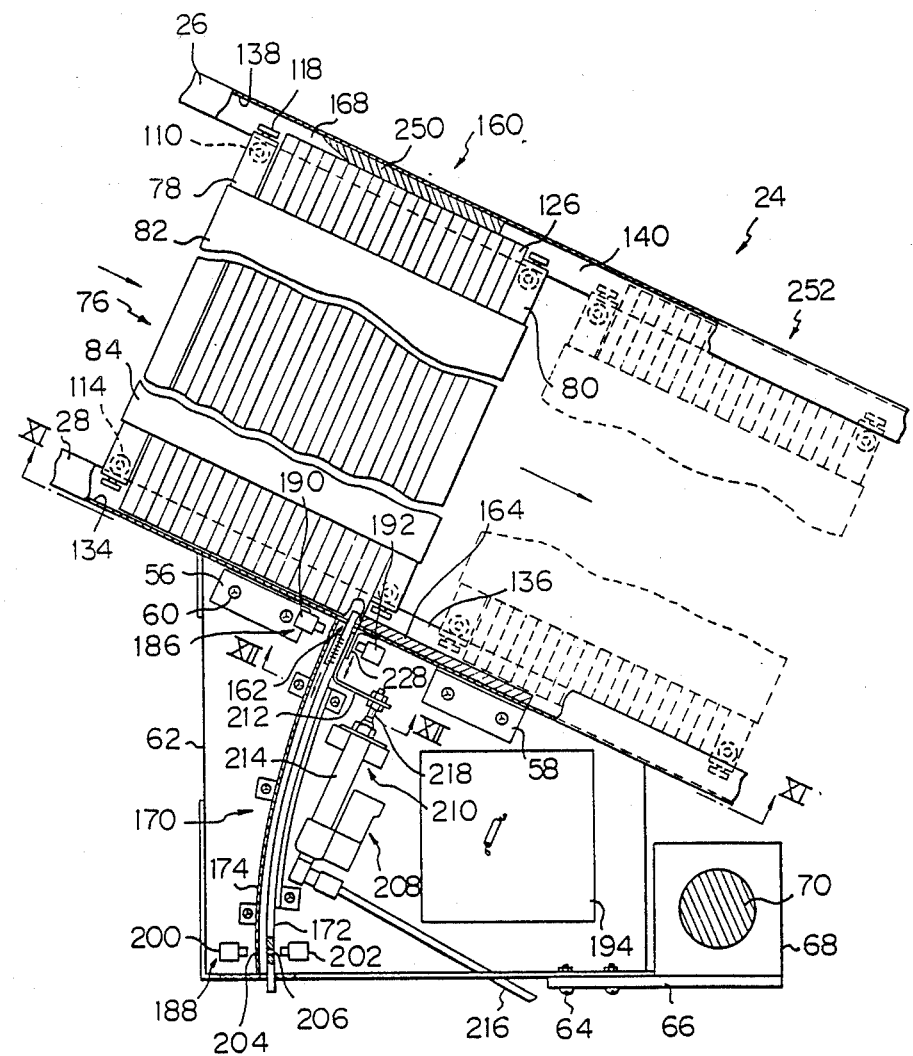
FIG. 2 is an enlarged side elevational view, partly in cross-section, of one of the component storing and feeding units as viewed in the direction of the arrow X in FIG. 1.

FIG. 2 shows one of the component storing and feeding units 24. The unit 24 includes a pair of parallel, opposite, upper and lower guiderails 26 and 28 for transferring stick-magazine holders, described later, and carrying a stack of stick magazines loaded with electronic components. As shown in FIGS. 1 and 2, the upper guiderail 26 is mounted inclined downward and rearward from its frontal end 30 toward the rear end 32.

Figure 3:
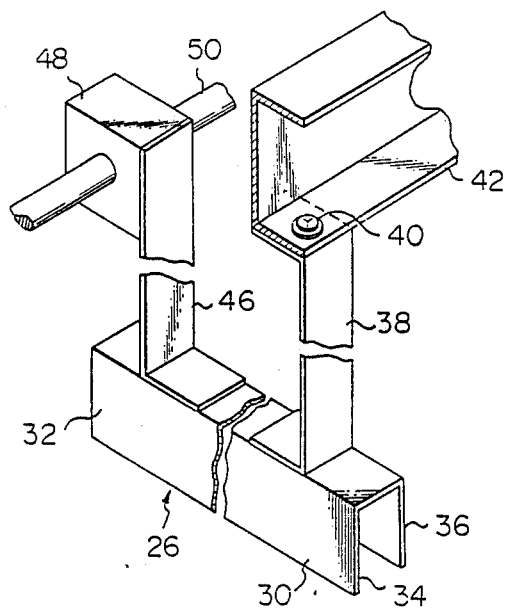
FIG. 3 is an enlarged perspective view, partly cut away, of the upper guiderail support structure.

As shown in FIGS. 1 and 3, the upper guiderail 26 is made from a rigid shaped channel member with the pair of flanges 34 and 36 directed downward. The frontal part 30 of the guiderail 26 is suspended by a bent metal plate 38 welded thereto which is bolted at 40 to a channel steel 42 which, in turn, is welded to a top cross member 44 of the frame structure 22. The rear part 32 of the upper guiderail 26 is suspended by an L-shaped angle 46 welded thereto which, in turn, is welded to a block 48 mounted on a stationary rod 50 which is supported in a pair of bearings 52 secured to another top cross member 54 of the frame 22. The block 48 is locked in position to the rod 50 by a setscrew (not shown).

The lower guiderail 28 is made from a rigid, shaped channel member similar to the upper guiderail 26, with its flanges facing the corresponding flanges 34 and 36 of the upper guiderail. As illustrated in FIG. 2, the lower guiderail 28 is mounted parallel to and spaced from the upper guiderail 26. Toward this end, a pair of angles 56 and 58 are welded to the bottom of the lower guiderail 28, which angles are bolted at 60 to a bracket 62. The bracket 62 is secured by bolts 64 to a plate 66 welded to a block 68 mounted on a stationary rod 70, which is supported in a pair of bearings 72 shown in FIG. 1 and mounted to an intermediate cross member 74 of the frame 22. The block 68 is also locked to the rod 70 by means of a setscrew (not shown).

Figure 4:
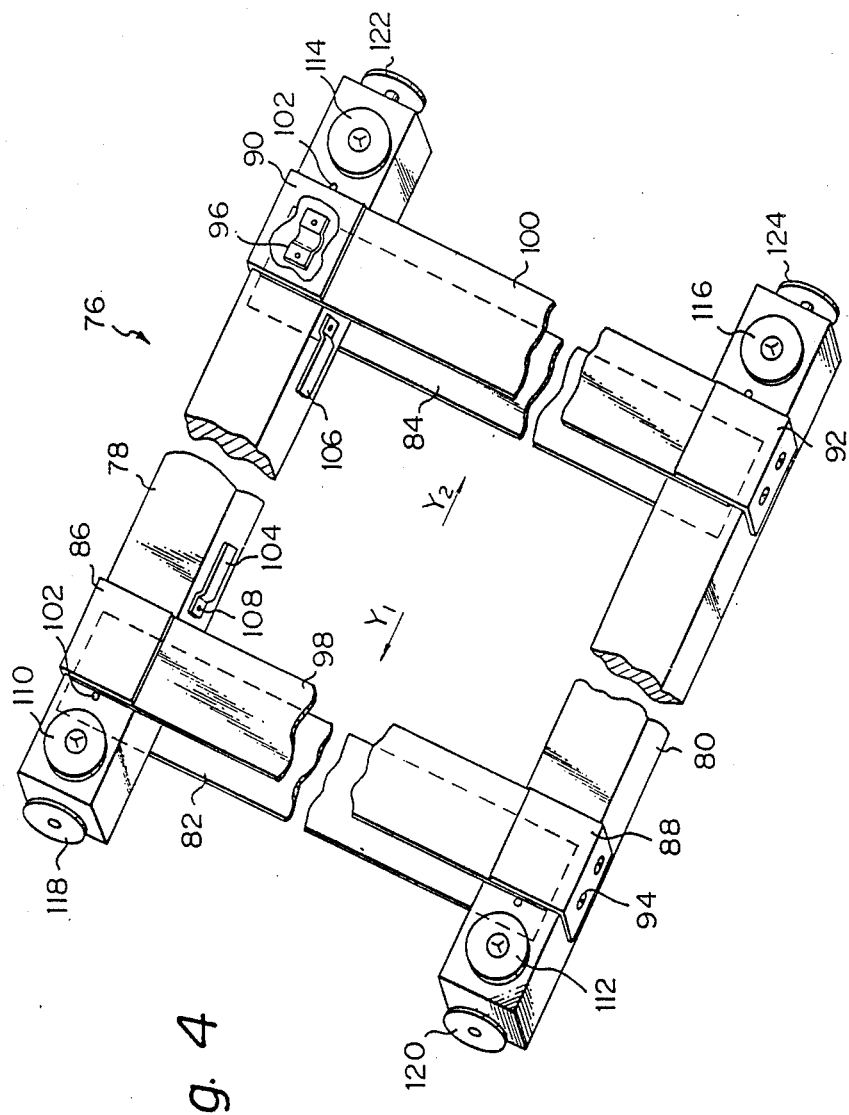
FIG. 4 is an enlarged perspective view, partly cut away, of the stick-magazine holder.

FIG. 4 illustrates a stick-magazine holder 76 adapted to be loaded on the guiderails for the transfer of a plurality of so-called "stick magazines" loaded with in-line lead type components such as DIP's. As described next, the stick-magazine holder 76 is designed to resiliently and frictionally retain a stack of stick magazines. Toward this end, the holder 76 comprises a pair of parallel frame members 78 and 80 rigidly connected with each other by a pair of side plates 82 and 84 secured to a side of the frame members by means of screws (not shown). Two pairs of retainers 86, 88 and 90, 92, made from bent metal plate, are secured by screws 94 to the frame members 78 and 80 adjacent to the side plates 82 and 84, respectively. Each retainer 86, 88, 90, and 92 is provided, spot-welded or rivetted at the inner side thereof facing respective frame members, with a leaf spring shown at 96. A pair of detachable side plates 98 and 100 are detachably inserted between the retainers and the frame members and are held resiliently biased by the leaf springs 96 against the side of the frame members 78 and 80. Stop pins 102 are provided on the frame members to limit the lateral position of the detachable side plates 98 and 100 during the course of insertion. A pair of leaf springs 104 and 106 are mounted by screws 108 to the inner side of the frame member 78.

The stick-magazine holder 76 is provided with carrier means to permit the holder to move along the guiderails 26 and 28. The carrier means comprise four wheels 110, 112, 114, and 116 mounted rotatably on the frame members 78 and 80 and designed to roll on the edges of flanges of the guiderails 26 and 28, and four disk-like lateral guides 118, 120, 122, and 124 mounted on the ends of the frame members 78 and 80 and adapted to engage within the channels or grooves of the guiderails 26 and 28 to delimit the lateral movement of the stick-magazine holder. These wheels and lateral guides are positioned out of the inside space defined by the frame members 78 and 80 so as not to interfere with stick magazines to be loaded on the holder.

Figure 5:
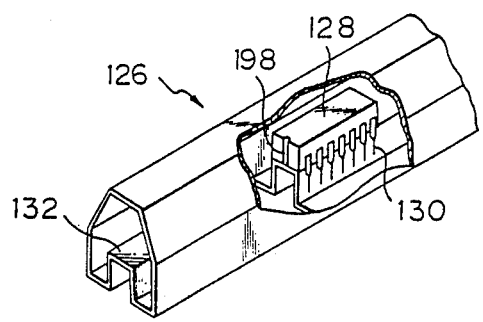
FIG. 5 is an enlarged perspective view, partly cut away, of the conventional stick magazine.

FIG. 5 illustrates a representative example of a stick magazine supplied from component manufacturers. The stick magazine 126 is made from a transparent plastic material and has a through-channel in which are received a predetermined number of components such as DIP's, one of which is indicated at 128. Each component 128 is provided with in-line leads 130 projecting at a right angle from the body. The stick magazine 126 has a land 132 on which DIP's rest. When the stick magazine 126 is held inclined, the DIP's will slide along the land 132 under the action of gravity and leave the magazine through one of the open ends of magazine.

Figure 6:
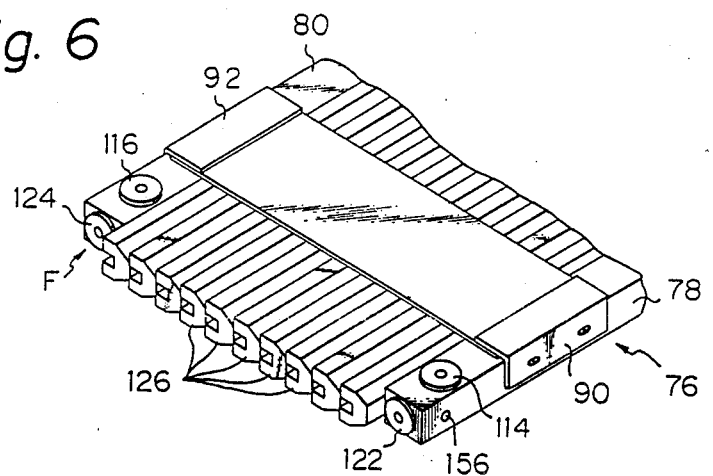
FIGS. 6 and 7 are perspective views of the lower and upper parts of the stick-magazine holder with the stick magazines retained therein.
Figure 7:
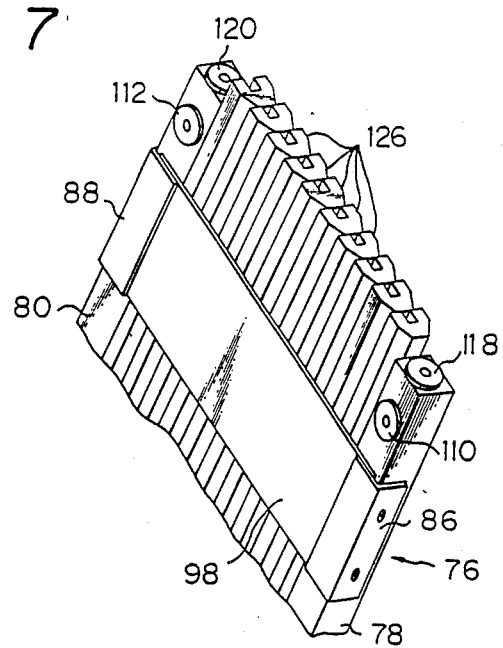

Referring to FIGS. 2, 6, and 7, the magazine holder 76 is loaded with a plurality of stick magazines 126, 10 in the illustrated example, which are stacked one on the other as shown. For loading, the removable side plates 98 and 100 are pulled, respectively, in the directions indicated by the arrows Y2 and Y1 (FIG. 4) and detached from the holder 76. Then, the stick magazines supplied from component manufacturer and loaded with DIP's are stacked one on the other from the lower frame member 80 toward the upper frame member 78 as viewed in FIG. 4. It will be noted that during loading, the DIP's will not slip out of the magazines because the open ends of the magazines as supplied by the component manufacturer are closed by suitable plugs (not shown). Thereafter, the side plates 98 and 100 are mounted under the retainers 86, 88, 90, and 92 to retain the stick magazines 126 sandwiched between the frame members 78 and 80. It should be noted that the detachable side plates 98 and 100 resiliently engage the stick magazines 126 under the action of leaf springs 96 to urge them against the opposite side plates 82 and 84 so that the stick magazines are held in position by frictional force exerted thereon. This prevents the stick magazines from shifting within or slipping out of the magazine holder 76 under the action of gravity during handling, but enables them to slide when an additional force is applied at an end thereof. Frictional retention of the stick magazines is also ensured by the leaf springs 104 and 106, which hold the stick magazines together.

It should be noted that, as shown in FIGS. 2 and 6, at least the lower part of each stick magazine 126 as mounted on the magazine holder 76 projects by a predetermined distance beyond the lower end F of the holder. Toward this end, the length of the magazine holder 76 must be selected to be slightly less than the length of the stick magazine available from the component manufacturers. After the required number of stick magazines are packed in the holder 76, the lower ends of the stick magazines are aligned and positioned at a predetermined distance from the lower end F of the holder as shown in FIGS. 2 and 6 by making use of an appropriate jig, to be described later.

Figure 8:
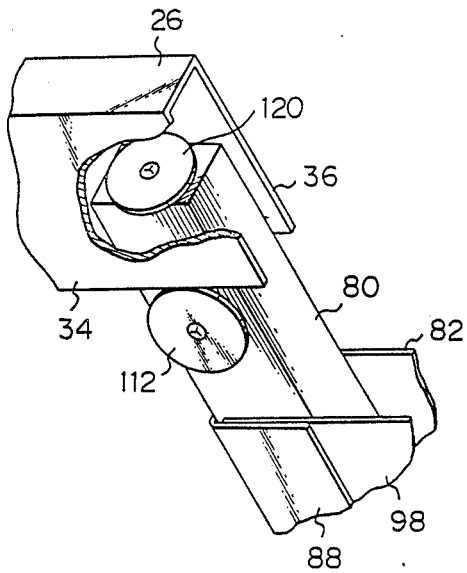
FIG. 8 is an enlarged perspective view, partly cut away, of parts of the stick-magazine holder and the upper guiderail.

As shown in FIG. 2, the stick-magazine holder 76 loaded with stick magazines 126 is loaded on the guiderails 26 and 28, with the lower ends of the stick magazines in close vicinity of or in slight sliding contact with the bottom 134 of the channel 136 of the lower guiderail 28 and with the upper end thereof spaced by a relatively large gap from the bottom 138 of the channel 140 of the upper guiderail 26, with the wheels 110, 112, 114, and 116 engaging the edges of the flanges of the guiderails 26 and 28 and with the lateral guides 118, 120, 122, and 124 engaging within the channels 136 and 140. FIG. 8 shows the manner by which the wheel and lateral guide engage with the upper guide rail 26, the stick magazines being omitted for the simplicity of illustration.

Figure 9:
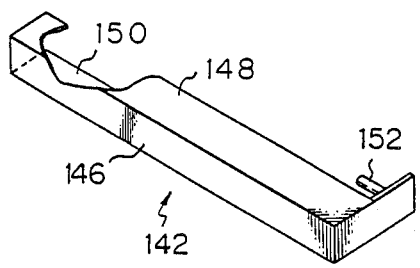
FIG. 9 is a perspective view, partly cut away, of the closure jig.
Figure 10:
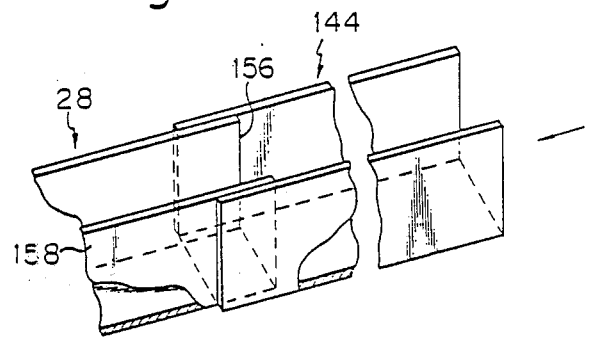
FIG. 10 is a perspective view, partly cut away, of the guide channel section attached to the lower guiderail.

Loading of the magazine holder onto the guiderails may be facilitated by a closure jig 142 shown in FIG. 9 and a guide channel section 144 shown in FIG. 10. As shown in FIG. 9, the closure jig 142 comprises a channel member having a web 146 and flanges 148 and 150 having a cross-section similar to that of the lower guiderail 28. Prior to loading of the magazine holder, plugs (not shown) are removed from the ends of the stick magazines 126 and a pin 152 provided on the closure jig 142 is engaged within a hole 156 (FIG. 6) provided in the frame member 78 of the magazine holder. The closure jig 142 is then urged by hand against the magazine holder until the edge of the flange 148 is brought into contact with the wheels 114 and 116. This causes the lower ends of respective stick magazines 126 to be aligned with each other and positioned at a predetermined distance from the lower end F of the magazine holder 76. The magazine holder 76, together with the closure jig 142 attached thereto for closing the lower end of stick magazines, is then placed on a guide channel section 144 which is welded to the lower guiderail 28 as shown in FIG. 10. The holder is pushed ahead until the closure jig 142 abuts against the frontal end face 156 (FIG. 10) of the guiderail 28. By holding the closure jig 142 by hand and by pushing the holder further ahead, the wheels 114 and 116 rolling on the edge of the flange 148 of the jig will now ride over the flange 158 of the lower guiderail 28 so that the stick magazine holder 76 charged with stick magazines is readily loaded on the guiderails 26 and 28. Thus, the holder is smoothly transferred from the jig 142 onto the guiderails. The magazine holder 76 loaded on the guiderails will move downward and rearward along the guiderails under the action of gravity into the component storage and release section 160 of the guiderails as shown in FIG. 2. During this movement, the lateral guides 118, 120, 122, and 124 snugly engage within the channels 136 and 140 of the guiderails 26 and 28 to thus restrict the lateral movement of the holder, thereby preventing the wheels 110, 112, 114, and 116 from running off the flanges of the guiderails.

Figure 11:
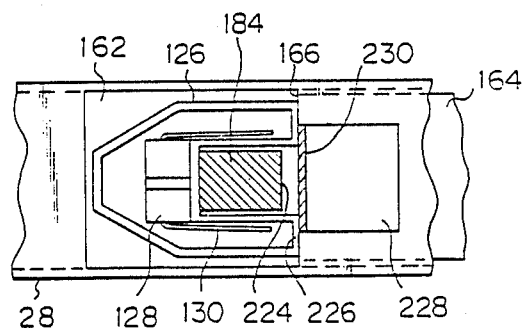
FIG. 11 is a bottom view, partly in cross-section and taken along the line XI—XI of FIG. 2, of the lower guiderail at the discharge opening.

Referring to FIGS. 2 and 11, the lower guiderail 28 has a component discharge opening 162 provided at its bottom near the rear extremity of the component storage and release section 160. As best shown in FIG. 11, the discharge opening 162 has an area slightly larger than the cross-section of the stick magazine 126.

As shown in FIG. 2, an abutment in the form of a stop bar 164 is mounted within the channel 136 on the bottom 134 of the lower guiderail 28 and adjacent to the discharge opening 162. The frontal end face of the stop bar 164 is registered with the rear edge 166 of the discharge opening 162 as shown in FIG. 11. As is apparent from FIG. 2, the stop bar 164 is disposed across the passageway in which the lower part of stick magazines projecting downward beyond the lower end of the holder 76 or lateral guides 122 and 124 will move as the holder travels along the guiderails 26 and 28. However, the stop bar 164 is positioned out of the passageway of the lower end or lateral guides of the holder. Toward this end, the thickness of the stop bar 164 is selected to be slightly smaller than the gap 168 formed between the upper end of the stick magazines and the bottom 138 of the channel 140 of the upper guiderail 26 so that the stop bar 164 may abut against the lower part of the stick magazines but does not interfere with the travel of the lateral guides 122 and 124.

Figure 12:
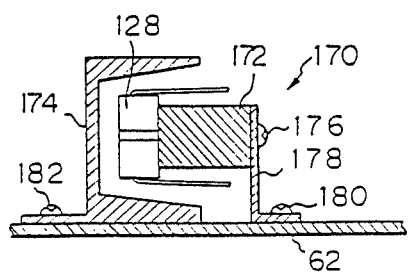
FIG. 12 is a cross-sectional view taken along the line XII—XII of FIG. 2.

As shown in FIG. 2, a raceway 170 extends from the discharge opening 162 along an arcuated path. As best shown in FIG. 12, the raceway 170 comprises a transfer rail 172 and elongated cover plate 174 cooperating with and spaced from the transfer rail 172. The transfer rail 172 is connected by screws 176 to a support 178 which, in turn, is secured by screws 180 to the bracket 62. The cover plate 174 is secured to the bracket 62 by screws 182. The upper end face of the transfer rail 172 is flush with the bottom 134 of the lower guiderail channel 136. As shown in FIG. 2, and best shown in FIG. 13, a stop and guide member 184 is welded to the upper end of the transfer rail 172 in an end-to-end relation and in alignment with the rail 172. The stop and guide member 184 has a length equal to the thickness of the stop bar 164. The stop and guide member 184 serves to abut against the reverse side of the land 132 of respective stick magazines as well as to guide the DIP's being released from the stick magazine onto the transfer rail 172. The lower end of the transfer rail 172 extends into a corresponding raceway (not shown) of the conventional magazine assembly 14.

Figure 13:
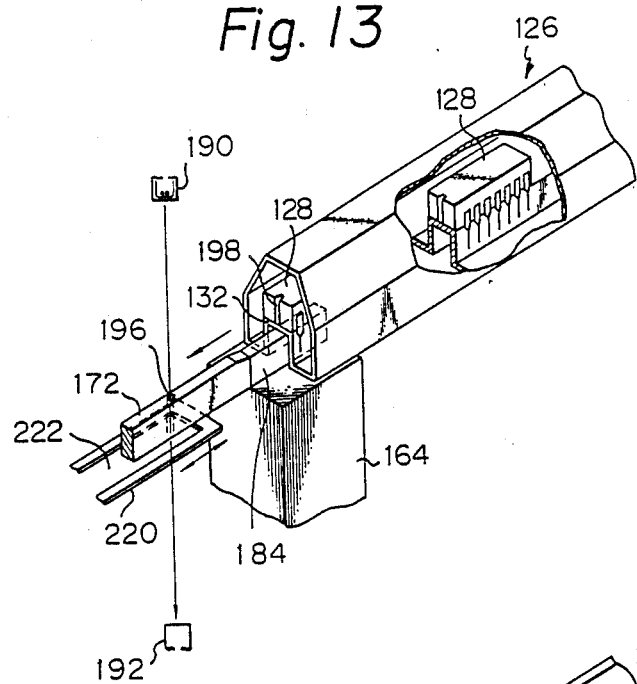
FIG. 13 is a perspective view, partly cut away, showing the arrangement of parts and members at the discharge opening.

Referring again to FIG. 2, component release monitoring means are provided across the raceway 170. The monitoring means comprise a first detecting means 186 arranged near the upper extremity of the raceway 170 and a second detecting means 188 located near the lower extremity thereof. As shown in FIGS. 2 and 13, the first detecting means 186 comprises a light emitter 190 and an associated photocell 192 connected to a control circuit 194. The light rays emitted from the light emitter 190 are directed toward the photocell 192 through an aperture (not shown) provided in the cover plate 174 and a hole 196 (FIG. 13) provided in the transfer rail 172. Thus, the issued light rays are interrupted by the leading end of each DIP sliding down along the transfer rail 172 but reach the photocell 192 as the trailing end thereof moves past the optical path so that a signal is issued each time one component moves across the detecting means 186. As the DIP's supplied by the component manufacturer are ordinarily provided with a slit 198 at the leading end thereof, as shown in FIG. 13, interruption and restoration of the light rays, and hence, issuance of a signal, take place for each passage of DIP, although the DIP's are released in the form of a successive train with the trailing end of one DIP in end-to-end contact with the leading end of a subsequent DIP. The second detecting means 188 similarly comprises a light emitter 200 and an associated photocell 202 connected to the control circuit 194. The light rays emitted by the light emitter 200 is adapted to pass through an aperture 204 in the cover plate 174 and an aperture 206 in the transfer rail 172.

As shown in FIGS. 2, 11, and 13, each storing and feeding unit 24 also includes pusher means generally designated 208 for shifting the empty stick magazines. The pusher means 208 comprises a reciprocable drive 210 and a pusher member 212 mounted thereto. The drive 210 includes a single-acting air-cylinder 214 connected by a pipe 216 to a suitable source of compressed air (not shown) and controlled by the control circuit 194. The pusher member 212 is a bent metal piece mounted to an output shaft 218 of the air-cylinder 214 and having an upper part 220 extending parallel to the transfer rail 172. As shown in FIG. 13, the upper part 220 of the pusher member is provided with a cutout 222 of a sufficient length so as not to interrupt the light rays from the light emitter 190 during the reciprocating movement thereof. The air-cylinder 214 is mounted on the bracket 62 with its axis parallel to the stick magazines in the holder 76 so that the upper part 220 of the pusher member 212 protrudes into and retracts from the discharge opening 162 in the lower guiderail 28 as the output shaft 218 is reciprocated. More specifically, the upper part 220 of the pusher member is positioned so as to move in the close vicinity of the rear periphery 166 of the discharge opening 162 along the rear face 224 of the stop and guide member 184 so that the part 220 abuts from below against the bottom 226 of stick magazine without damaging the leads 130 of the DIP (see FIGS. 11 and 13). In the retracted inoperative position of the pusher member 212 shown in FIG. 13, the upper part 220 is held apart from the discharge opening 162. In order to ensure the upper part 220 of the pusher member smoothly slides into the discharge opening 162, adjacent to its periphery 166, an L-shaped guide 228 is welded to the lower guiderail 28 as shown in FIGS. 2 and 11. The guide 228 has an upright flange 230 aligned with the periphery 166 of the discharge opening 162 and extending parallel to the transfer rail 172.

Figure 14:
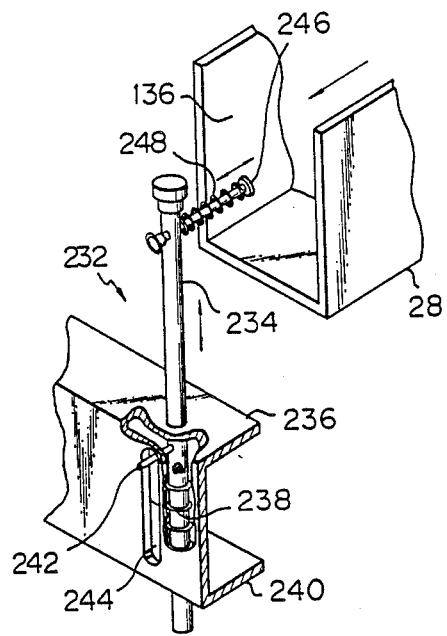
FIG. 14 is a perspective view, partly cut away, of the empty holder stopper mechanism.

Referring to FIG. 14, there is shown a stop mechanism 232 provided at the rear end of the lower guiderail 28 and serving to prevent the empty magazine holder from sliding out the guiderail. The empty holder stop mechanism 232 includes a movable stopper rod 234 mounted slidably on a channel steel 236 forming part of the frame structure 22 shown in FIG. 1. The stopper rod 234 is biased upward by a helical spring 238 having one end connected to the rod 234 and another end abutting against a lower flange 240 of the channel member 236. The stroke of the stopper rod 234 is limited by a pin 242 engaging in a vertical slot 244 provided in the channel member 236. The length of the stopper rod 234 as well as the length of the slot 244 are so determined that, in the protracted position of the rod 234, the upper end thereof is positioned on the extension of the channel 136 of the lower guiderail 28 but the upper end is removed out of the channel 136 when the rod 234 is pressed down. The movable stopper rod 234 is provided at its upper part with a means for dampening the shock to be produced as a moving magazine holder abuts against the rod. The shock dampening means comprises a movable stop pin 246 mounted slidably on the upper part of the stopper rod 234 and biased toward the channel 136 by a helical spring 248.

The operation of the storing and feeding unit 24 is as follows. As described hereinbefore, a plurality of stick magazines, numbering 10 in total in the illustrated example, each loaded with a predetermined number of DIP's, are assembled in the magazine holder 76. The thus prepared magazine holder 76 is loaded on the guiderails 26 and 28 as mentioned. The loaded magazine holder moves along the slanted guiderails under the action of gravity into the storage and release section indicated at 160 in FIG. 2, whereupon the downward projecting lower part of the first or rear-most stick magazine abuts against the abutment 164, thereby to stop the holder in the position shown in FIG. 2. In this position, the stop and guide member 184 also abuts against the reverse side of the land 132 of the stick magazine and the first stick magazine is aligned with the discharge opening 162. Thus, the DIP's received in the first stick magazine are released therefrom under the action of gravity and, by being guided by the stop and guide member 184, transferred onto the raceway 170.

The release of DIP's is monitored by the first and second detecting means 186 and 188, which issue a signal to the control circuit 194 for each passage of a DIP. The control circuit 194 counts the number of signals from both detecting means and operates the air-cylinder 214 only when the counted numbers for both first and second detecting means become equal to the predetermined number of DIP's received in one stick magazine. The first detecting means 186 is capable of detecting a condition that all the DIP's received in a particular magazine are released toward the raceway 170 while the second detecting means 188 is capable of detecting a condition that all the DIP's in the raceway 170 are discharged toward the inserting machine. By providing two detecting means, one of which is located at the entrance end of the raceway and the other of which is positioned at the exit end of the raceway, and by operating the air-cylinder in response to both detecting means, it is possible to detect the jamming of DIP's either in the stick magazine or in the raceway and avoid operation of the pusher means despite DIP jamming.

On actuation of the air-cylinder, the pusher member 212 engages the lower end of the first, empty stick magazine causing it to shift upward against the frictional forces applied thereon by means of leaf springs 96, 104, and 106 of the magazine holder 76. The first stick magazine, driven by the pusher member, moves within the magazine holder until the upper end thereof abuts against the bottom 138 of the upper guiderail 26. It should be noted that at this moment the second or next stick magazine will remain in the initial position due to the frictional forces exerted thereon. In order to prevent the next stick magazine from being shifted together with the first empty stick magazine, it is advantageous to provide within the channel 140 of the upper guiderail 26 a shoe 250 having a thickness roughly equal to that of the stop bar 164, as shown in FIG. 2. The shoe 250 may be secured to the bottom 138 of the upper guiderail 26. As shown, the shoe 250 may comprise a wedge-like tapered frontal part, an intermediate part substantially occupying the gap 168 formed between the upper end of the stick magazines and the bottom 138 of the upper guiderail 26, and a rear end terminating at the next stick magazine located subsequent to the discharge opening 162.

As the first, rear-most, now empty stick magazine is thus disengaged from the stop bar 164, the magazine holder 76 as a whole then moves by one step downward and rearward along the guiderails under the action of gravity until the next stick magazine filled with DIP's is brought into contact with the stop bar 164 and aligned with the discharge opening 162. The components in the next stick magazine are then released toward the raceway 170 according to the speed of the component inserting machine. As the DIP's in the next stick magazine are depleted, the pusher means is again actuated to shift the next stick magazine to release from the stop bar 164, permitting the magazine holder to move by one step, so that the third stick magazine is brought into alignment with the discharge opening. The above operations are repeated in sequence until the last stick magazine, the tenth magazine, in the illustrated example, is released from the abutment 164. Upon release of the last stick magazine, the magazine holder moves down along the guiderails under the action of gravity into the empty holder storage section 252 as shown by the phantom line in FIG. 2, thereby permitting another magazine holder to move into the component storage and release section 160 as shown by the solid line. Thus, the supply of components is assured without interruption.

The empty stick magazine holder moved into the empty holder storage section 252 engages the stop mechanism 232 and thus is temporarily held on the guiderails. The empty magazine holder may be unloaded from the guiderails by the operator by pressing down the movable stopper rod 234. The empty magazine holder is disassembled and the empty stick magazines may be returned to the component manufacturer. Fresh stick magazines charged with the components are then mounted on the magazine holder which is then loaded on the guiderails as mentioned. Alternatively, it is also possible not to disassemble the empty magazine holder but to simply fill the empty stick magazines with the components.

While the present invention has been described herein with reference to a specific embodiment thereof, it is contemplated that the invention is not limited thereby but a considerable variation may be made without departing from the spirit of the invention. For example, the length of the guiderails may be such that more than two magazine holders are stored for each one of the component storage and release section and the empty holder storage section.

Furthermore, the upper and lower guiderails may have various other cross-sections, such as an L-shape or an inverted T-shape. In that event, the carrier means may comprise flanged wheels each having one or two flanges engaging the flange or web of the guiderails.

Also, the number of stick magazine retained in one magazine holder may be varied.

It is also possible to construct the carrier means in the form of sliders slidably engaging the guiderails and made from a material having a small coefficient of friction. In the case where the magazine holders are wheeled holders as illustrated, the angle of inclination of the guiderails with respect to the horizontal plane may preferably be about 25 degrees.

Some kinds of electronic components in current manufacture are not provided with slits 198 at the leading end thereof as shown in FIGS. 5 and 13. If components without slits 198 are supplied from the stick magazines into the raceway 170 in the form of a continuous train of components with leading ends in close contact with trailing ends, the first and second component detecting means 186 and 188 would not issue a signal for each passage of components. In that case, the control circuit 194 may be designed to actuate the pusher 208 on the condition that a predetermined time period has elapsed after the release of components has started and that neither the first or second detecting means detect the presence of a component interrupting their optical paths. The released components normally move smoothly through the raceway under the action of gravity in the form of a continuous train, with the first or lowermost component in the train being subjected to the largest downward force due to the pressure of the subsequent moving components. The downward force successively declines from the lower to the upper components in the train so that the last or uppermost component will be subjected only to the action of gravity. Thus, the last component in the train tends to move behind in distance from the preceding components and is impeded in advance movement by even a slight obstacle, thereby causing clogging or jamming of the raceway. In most instances, jamming occurs at the upper and lower ends of the raceway, at which ends the raceway is connected to the adjacent parts of the apparatus. By actuating the pusher only after elapse of a predetermined time period after the start of component release and by operating the pusher only when neither the first or second detecting means detects the presence of a component, it is possible to avoid the actuation of the pusher in the event of component jamming. The aforementioned time period may be selected to allow the last component in the train to pass through the second detecting means.

We claim:

1. Apparatus for storing and feeding electronic components having in-line leads to a machine for sequentially inserting the components in a circuit board, which comprises:
   a frame and
   a series of component storing and feeding units mounted on said frame in a side-by-side relationship;
   each of said component storing and feeding unit comprising;
   (a) at least two stick-magazine holders for resiliently retaining by friction a stack of stick magazines, extending vertically and arranged one on the other, in such a manner as to prevent said stick magazines from sliding within said holders under the action of gravity but to permit said stick magazines to slide longitudinally within said holders when an additional force is applied at an end thereof, each of said stick magazines having open ends and adapted to receive a plurality of components to be inserted in the circuit board, said stick-magazine holders having a length less than that of said stick magazines so that a length of said stick magazines when retained in said holders; projects by a predetermined distance beyond said holders;
   (b) a pair of parallel, opposite, upper and lower guiderails secured to said frame and spaced apart from each other along a vertical plane for movably supporting said stick-magazine holders therebetween and for guiding said holders along a predetermined path, said guiderails having an open frontal end and an open rear end to permit said holders to be loaded on and unloaded from said guiderails, said guiderails being slanted from said frontal end down toward said rear end to permit said holders to travel rearward and downward along said path under the action of gravity when said holders are loaded on said guiderails, said guiderails having a component storage and release section at the frontal part thereof for storing at least one stick-magazine holder carrying stick magazines charged with the components and for releasing the components therefrom and an empty holder storing section at the rear part thereof for storing at least one empty stick-magazine holder carrying depleted stick magazines deprived of the components, said upper and lower guiderails being spaced such that the outermost inner portions thereof are spaced apart from each other with a distance slightly greater than the length of said stick magazines so that a predetermined gap is left between said portions and the ends of said stick magazines at either ends of said stick magazines when said holders are loaded on said guiderails, the lower end of said stick magazines when said holders are loaded on said component storage and release section of the guiderails being disposed in the close vicinity or in a slight sliding contact with said outermost inner portion of said lower guiderail so that said gap is left between the upper end of said stick magazines and the outermost inner portion of said upper guiderail, said lower guiderail having a component discharge opening therethrough at the substantially rear end of said component storage and release section;

(c) carrier means mounted on said stick-magazine holders and engageable with said guiderails for movably carrying and guiding said holders to travel along said slanted guiderails under the action of gravity;

(d) an abutment arranged adjacent to said discharge opening and across the passageway in which the lower part of said stick magazines projecting downward beyond said holders is to travel, for abutting against said projecting lower part of any stick magazine in one holder to stop said holder with said any stick magazine aligned with said discharge opening;

(e) a raceway extending from said discharge opening down to said component inserting machine for delivering the components in said stick magazine aligned with said discharge opening toward said inserting machine;

(f) means for monitoring a condition in which all the components in said stick magazine at said discharge opening are released therefrom; and (g) pusher means responsive to said monitoring means for pushing an empty stick magazine at said discharge opening to shift it upward out of engagement with said abutment to release said magazine holder to move by one step along said guiderails under the action of gravity until a subsequent stick magazine receiving the components is brought to abut said abutment and aligned with said discharge opening, said pusher means operating each time any one stick magazine brought at said discharge opening is depleted so that upon completion of release of the components from the last stick magazine in one magazine holder, said holder is disengaged from said abutment to travel away from said component storage and release section under the action of gravity into said empty holder storage section of the guiderails thereby permitting a subsequent stick-magazine holder carrying stick-magazines charged with the components to move into said component storage and release section to assure a continuous supply of the components to said inserting machine.

2. Apparatus as in claim 1, wherein said guiderails comprise shaped channel members having opposite channels therein, each of said channel members having flanges directed toward the flanges of the other channel member.

3. Apparatus as in claim 2, wherein said carrier means comprises wheels rotatably mounted on said stick-magazine holder and engageable with the flanges of said channel members forming the guiderails.

4. Apparatus as in claim 3, wherein said carrier means further comprises means engageable with said flanges of said channel members for limiting the lateral movement of said stick-magazine holder.

5. Apparatus as in claim 4, wherein said means for limiting the lateral movement of the holder comprises disk-like lateral guide members mounted on said stick-magazine holder and slidingly received within said channels of said channel members.

6. Apparatus as in claim 1, wherein each of said stick-magazine holders comprises a pair of spaced, parallel frame members, at least one first side plate secured to a side of said frame members and rigidly connecting said frame members with each other, at least one second side plate mounted detachably on the other side of said frame members opposite said first side plate, said first and second side plates being spaced from each other for receiving a stack of said stick magazines therebetween in a sandwiched relationship, and means for resiliently biasing said second side plate toward said first side plate to frictionally retain said stick magazines therebetween.

7. Apparatus as in claim 6, wherein each of said stick-magazine holders further comprises means provided on said frame member for resiliently biasing said stick magazines with each other.

8. Apparatus as in claim 2, wherein said abutment comprises a stop bar mounted within said channel of said lower guiderail and secured on the bottom thereof, said stop bar having a frontal end registered with the rear periphery of said discharge opening, said stop bar having a thickness slightly smaller than the length of said predetermined gap.

9. Apparatus as in claim 1, further comprising means for preventing stick magazines located subsequent to said stick magazine aligned with said discharge opening from being shifted upward together with said empty stick magazine at said discharge opening as the latter is propelled by said pusher means.

10. Apparatus as in claim 9, wherein said means for preventing shifting of subsequent stick magazines comprises a shoe mounted on said upper guiderail and having a thickness slightly smaller than the length of said predetermined gap, said shoe having a rear end terminating at a stick magazine located subsequent to said stick magazine at said discharge opening.

11. Apparatus as in claim 1, wherein each of said component storing and release section and said empty holder storing section of said guiderails has a sufficient length to receive at least two stick-magazine holders therein.

12. Apparatus as in claim 1, wherein said raceway comprises a component transfer rail and an associated cover member spaced therefrom and wherein a stop and guide member is bonded at the upper end of said transfer rail to guide the components being released from said stick magazine at said discharge opening to slide onto said transfer rail.

13. Apparatus as in claim 1, wherein said component storing and feeding unit further comprises a releasable stop means provided in the vicinity of the rear end of said lower guiderail for engaging said empty stick-magazine holder moving into said empty holder storing section to prevent said holder from slipping out of said guiderails.

14. Apparatus as in claim 13, wherein said releasable stop means comprises a vertically movable stopper rod mounted on said frame for up-and-down movement, said stopper rod being movable between an operative position in which the upper end thereof is located across said path of said holders and an inoperative position in which said upper end retracts from said path.

15. Apparatus as in claim 14, wherein said stopper rod is spring-biased toward said operative position so that, upon manually pressing down said upper end, said stopper rod is retracted to said inoperative position.

16. Apparatus as in claim 15, wherein said movable stopper rod further comprises means for dampening shock exerted thereon by said moving holder as said holder abuts against said stopper rod.

17. Apparatus as in claim 1, wherein said monitoring means comprises a first detecting means provided across said raceway at the upper end thereof for detecting the number of components delivered past said raceway upper end and a second detecting means provided across said raceway at the lower end thereof for detecting the number of components passed said lower end, and wherein said pusher means is operable in response to said first and second detecting means when the numbers of components detected by said first and second detecting means are equal to the predetermined number of components received in a stick magazine.

18. Apparatus as in claim 1, wherein said pusher means comprises a reciprocable drive means responsive to said monitoring means and a pusher member attached to said drive means for reciprocating movement into and away from said discharge opening to cause said empty stick magazine aligned with said discharge opening to shift upward out of engagement with said abutment.

19. Apparatus as in claim 18, wherein said pusher member is positioned along the rear periphery of said discharge opening so as not to interfere or damage the leads of the components released from said stick magazines.

20. Apparatus as in claim 2, further comprising a channel section connected to the frontal end of said lower guiderail on the extension thereof for facilitating the loading of said stick-magazine holders onto said guiderails, said channel section having an inner cross-section fitting the outer cross-section of said channel member forming the lower guiderail.

* * * * *